(12) United States Patent
Watanabe

(10) Patent No.: US 7,245,518 B2
(45) Date of Patent: Jul. 17, 2007

(54) FERROELECTRIC MEMORY

(75) Inventor: Kenya Watanabe, Suwa (JP)

(73) Assignee: Seiko Epson Corporation (JP)

( * ) Notice: Subject to any disclaimer, the term of this patent is extended or adjusted under 35 U.S.C. 154(b) by 106 days.

(21) Appl. No.: 11/249,252

(22) Filed: Oct. 13, 2005

(65) Prior Publication Data
US 2006/0120134 A1    Jun. 8, 2006

(30) Foreign Application Priority Data
Dec. 2, 2004   (JP)   ............ 2004-349995

(51) Int. Cl.
G11C 11/22   (2006.01)
(52) U.S. Cl. .............. 365/145; 365/65; 365/189.11
(58) Field of Classification Search ............ 365/65
See application file for complete search history.

(56) References Cited

U.S. PATENT DOCUMENTS

| 5,524,093 | A | * | 6/1996 | Kuroda | 365/145 |
| 5,703,804 | A | * | 12/1997 | Takata et al. | 365/145 |
| 6,097,622 | A | | 8/2000 | Shimizu et al. | |
| 6,191,971 | B1 | * | 2/2001 | Tanaka et al. | 365/145 |
| 6,301,145 | B1 | * | 10/2001 | Nishihara | 365/145 |
| 6,490,189 | B1 | * | 12/2002 | Kang et al. | 365/145 |
| 6,781,862 | B2 | * | 8/2004 | Takahashi et al. | 365/145 |
| 6,925,030 | B2 | * | 8/2005 | Kang | 365/230.06 |

FOREIGN PATENT DOCUMENTS

| JP | 10-229171 | 8/1998 |
| JP | 2001-283583 | 10/2001 |

* cited by examiner

Primary Examiner—Tan T. Nguyen
(74) Attorney, Agent, or Firm—Harness, Dickey & Pierce, P.L.C.

(57) ABSTRACT

A ferroelectric memory includes a memory cell array having a plurality of memory cells with ferroelectric capacitors arranged therein, a plurality of word lines, a plurality of plate lines, and a plurality of plate line selection circuits. An L-th plate line selection circuit among the plurality of plate line selection circuits includes a first transistor that is provided between an L-th plate line and a supply node for supplying an I-th plate line selection signal and turns on when a K-th word line is set to a selection voltage to thereby supply the I-th plate line selection signal to the L-th plate line, and a second transistor that is provided between the L-th plate line and a first power supply and turns on when the K-th word line is set to a non-selection voltage to thereby set the L-th plate line to a voltage level of the first power supply.

12 Claims, 11 Drawing Sheets

FIG. 1A
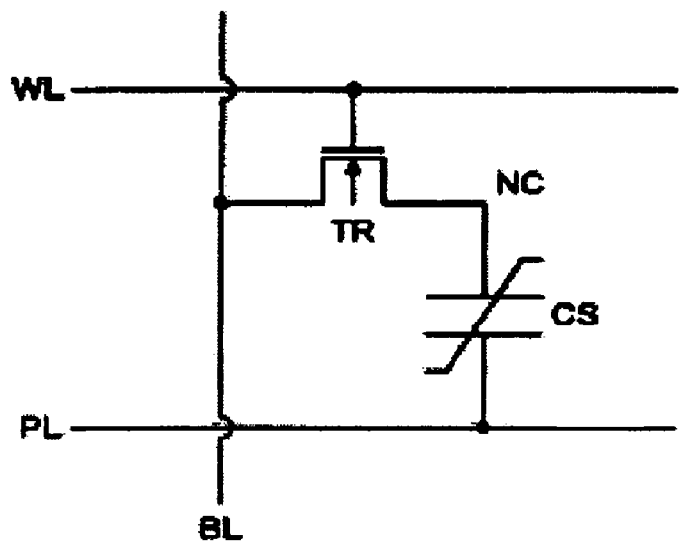
FIG. 1B
| | "1" | "0" |
|---|---|---|
| BL | VCC | 0V |
| PL | 0V | VCC |
FIG. 1C
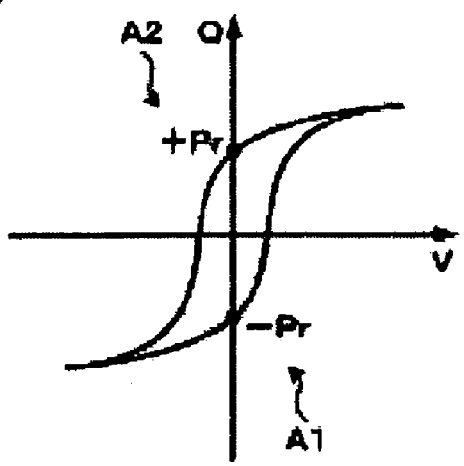

WRITING

READING
(REWRITING)

FERROELECTRIC MEMORY

BACKGROUND

1. Technical Field

The present invention relates to ferroelectric memories.

2. Related Art

In recent years, ferroelectric memories (FeRAMs: Ferroelectric Random Access Memories) that use ferroelectric capacitors as data storage capacitors have been in the limelight. These ferroelectric memories are widely used as memories that are mounted on transponders of RFID (Radio Frequency Identification) systems.

Large parasitic capacitance is present on word lines and plate lines of ferroelectric memories, and in particular, larger capacitance is parasitic on the plate lines. For this reason, a technology to have plate lines corresponding to each single word line hierarchized into a plurality of local plate lines by using plate line selection signals is known.

However, such a technology entails a problem in that the circuit size becomes larger as the plate lines are hierarchized by using NAND circuits and inverter circuits.

Also, a variety of technologies concerning drive circuits for driving word lines and plate lines of ferroelectric memories is known.

However, the aforementioned technologies entail a problem in that a voltage to be supplied to the word lines may become lower than the power supply voltage VCC due to the influence of the threshold voltage of transistors. As the selection voltage of word lines becomes less than VCC, a failure occurs in writing a logical value "1" in a memory cell, and this leads to a larger problem, particularly when the power supply voltage is designed to supply a low voltage. JP-A-10-229171 and JP-A-2001-283583 are examples of related art.

SUMMARY

In accordance with an advantage of some aspects of the present invention, there is provided a ferroelectric memory that can drive plate lines with a smaller sized circuit structure.

In accordance with an embodiment of the invention, a ferroelectric memory includes a memory cell array having a plurality of memory cells with ferroelectric capacitors arranged therein, a plurality of word lines, a plurality of plate lines, and a plurality of plate line selection circuits. An L-th plate line selection circuit among the plurality of plate line selection circuits includes a first transistor that is provided between an L-th plate line and a supply node for supplying an I-th plate line selection signal and turns on when a K-th word line is set to a selection voltage to thereby supply the I-th plate line selection signal to the L-th plate line, and a second transistor that is provided between the L-th plate line and a first power supply and turns on when the K-th word line is set to a non-selection voltage to thereby set the L-th plate line to a voltage level of the first power supply. An M-th plate line selection circuit among the plurality of plate line selection circuits includes a third transistor that is provided between an M-th plate line and a supply node for supplying a J-th plate line selection signal and turns on when the K-th word line is set to a selection voltage to thereby supply the J-th plate line selection signal to the M-th plate line, and a fourth transistor that is provided between the M-th plate line and the first power supply and turns on when the K-th word line is set to a non-selection voltage to thereby set the M-th plate line to a voltage level of the first power supply.

According to an aspect of the embodiment of the invention, when the K-th word line is set to the non-selection voltage, the second transistor turns on, and the L-th plate line (local plate line) is set to the voltage level of the first power supply. Then, when the K-th word line is set to the selection voltage, the first transistor turns on, such that the I-th plate line selection signal is supplied to the L-th plate line. By this, the L-th plate line is driven by the I-th plate line selection signal, whereby data can be written in or read from memory cells connected to the L-th plate line. Also, according to an aspect of the invention, when the K-th word line is set to the non-selection voltage, the fourth transistor turns on such that the M-th plate line (local plate line) is set to the voltage level of the first power supply. Then, when the K-th word line is set to the selection voltage, the third transistor turns on, such that the J-th plate line selection signal is supplied to the M-th plate line. By this, the M-th plate line is driven by the J-th plate line selection signal, whereby data can be written in or read from memory cells connected to the M-th plate line.

Also, according to another aspect of the invention, the inverter circuit that receives an input signal from the K-th word line and outputs an inversion signal of the input signal may be shared between the L-th plate line selection circuit and the M-th plate line selection circuit.

By so doing, the number of inverter circuits can be reduced, such that the circuit can be made smaller.

According to a still another aspect of the invention, a plate line selection signal may be shared between a plate line selection circuit for the K-th word line and a plate line selection circuit for a (K+1)-th word line.

By so doing, the plate line selection signal can be hierarchized through sharing the plate line selection signal by a plurality of plate line selection circuits. It is noted that the number of word lines that share the plate line selection signal is not limited to two, but may be three or more.

According to a further aspect of the invention, the ferroelectric memory may further include a plurality of word line step-up circuits, wherein a K-th word line step-up circuit among the plurality of word line step-up circuits may include a step-up capacitor having one end connected to the K-th word line and another end connected to a first node, and a fifth transistor that is provided between a supply node for supplying a step-up control signal and the first node, and that turns on when the K-th word line is set to a selection voltage to thereby supply the step-up control signal to the first node.

According to an aspect of the invention, when the K-th word line is set to the selection voltage, the fifth transistor turns on and the step-up control signal is supplied to the first node. Accordingly, by changing the voltage level of the step-up control signal, the voltage on the K-th word line can be stepped up by capacitive coupling of the step-up capacitor.

Also, according to another aspect of the invention, the K-th word line step-up circuit may include a sixth transistor that is provided between the first node and the first power supply, and that turns on when the K-th word line is set to a non-selection voltage to thereby set the first node to the voltage level of the first power supply.

By so doing, the voltage level on the K-th word line can be rapidly changed through capacitive coupling of the step-up capacitor.

According to a still another aspect of the invention, the ferroelectric memory may include a step-up control signal generation circuit that generates the step-up control signal, wherein the step-up control signal generation circuit may set the step-up control signal to be active during a given period after a plate line timing signal for setting signal change timings of the I-th and J-th plate line selection signals becomes non-active from active.

By so doing, during the given period after the plate line timing signal becomes active (after plate line selection), the step-up control signal can be made active such that the stepped up state of the word line voltage can be maintained, whereby proper writing of data to memory cells can be achieved.

Also, according to a further aspect of the invention, the inverter circuit that receives a signal from the K-th word line and outputs an inversion signal of the inputted signal may be shared by the L-th plate line selection circuit, the M-th plate line selection circuit and the K-th word line step-up circuit.

By so doing, the number of inverter circuits can be reduced and the circuit can be made smaller.

In accordance with another embodiment of the invention, a ferroelectric memory includes a memory cell array having a plurality of memory cells with ferroelectric capacitors arranged therein, a plurality of word lines, a plurality of plate lines, a plurality of plate line selection circuits, and a plurality of word line step-up circuits. An L-th plate line selection circuit among the plurality of plate line selection circuits includes a first transistor that is provided between an L-th plate line and a supply node for supplying an I-th plate line selection signal, and that turns on when a K-th word line is set to a selection voltage to thereby supply the I-th plate line selection signal to the L-th plate line, and a second transistor that is provided between the L-th plate line and a first power supply, and that turns on when the K-th word line is set to a non-selection voltage to thereby set the L-th plate line to a voltage level of the first power supply. A K-th word line step-up circuit among the plurality of word line step-up circuits includes a step-up capacitor having one end connected to the K-th word line and another end connected to a first node, and a third transistor that is provided between a supply node for supplying a step-up control signal and the first node, and that turns on when the K-th word line is set to a selection voltage to thereby supply the step-up control signal to the first node.

According to an aspect of the embodiment of the invention, when the K-th word line is set to the selection voltage, the first transistor turns on, such that the I-th plate line selection signal is supplied to the L-th plate line. By this, the L-th plate line is driven by the I-th plate line selection signal, whereby data can be written in or read from memory cells connected to the L-th plate line. Also, according to an aspect of the embodiment of the invention, when the K-th word line is set to the selection voltage, the third transistor turns on, such that a step-up control signal is supplied to the first node. Accordingly, by changing the voltage level of the step-up control signal, the voltage on the K-th word line can be stepped up by capacitive coupling of the step-up capacitor.

Also, according to another aspect of the invention, the K-th word line step-up circuit may include a fourth transistor that is provided between the first node and the first power supply, and that turns on when the K-th word line is set to a non-selection voltage to thereby set the first node to a voltage level of the first power supply.

By so doing, the voltage level on the K-th word line can be rapidly changed by capacitive coupling of the step-up capacitor.

According to a still another aspect of the invention, the ferroelectric memory may include a step-up control signal generation circuit that generates the step-up control signal, wherein the step-up control signal generation circuit may set the step-up control signal to be active during a given period after a plate line timing signal for setting the signal change timing of the I-th plate line selection signal becomes non-active from active.

By so doing, during the given period after the plate line timing signal becomes active, the step-up control signal can be made active such that the stepped up state of the word line voltage can be retained, whereby proper writing of data to memory cells can be achieved.

In accordance with still another embodiment of the invention, a ferroelectric memory includes a memory cell array having a plurality of memory cells with ferroelectric capacitors arranged therein, a plurality of word lines, a plurality of plate lines, and a plurality of word line step-up circuits. A K-th word line step-up circuit among the plurality of word line step-up circuits includes a step-up capacitor having one end connected to a K-th word line and another end connected to a first node, and a first transistor that is provided between a supply node for supplying a step-up control signal and the first node, and that turns on when the K-th word line is set to a selection voltage to thereby supply the step-up control signal to the first node.

According to an aspect of the invention, when the K-th word line is set to the selection voltage, the first transistor turns on such that the step-up control signal is supplied to the first node. Accordingly, by changing the voltage level of the step-up control signal, the voltage on the K-th word line can be stepped up by capacitive coupling of the step-up capacitor.

Also, according to another aspect of the invention, the K-th word line step-up circuit may include a second transistor that is provided between the first node and a first power supply, and that turns on when the K-th word line is set to a non-selection voltage to thereby set the first node to a voltage level of the first power supply.

By so doing, the voltage level on the K-th word line can be rapidly changed by capacitive coupling of the step-up capacitor.

BRIEF DESCRIPTION OF THE DRAWINGS

FIGS. 1A–1C are diagrams for explaining a memory cell of a ferroelectric memory.

DESCRIPTION OF EXEMPLARY EMBODIMENTS

Figure 2A:
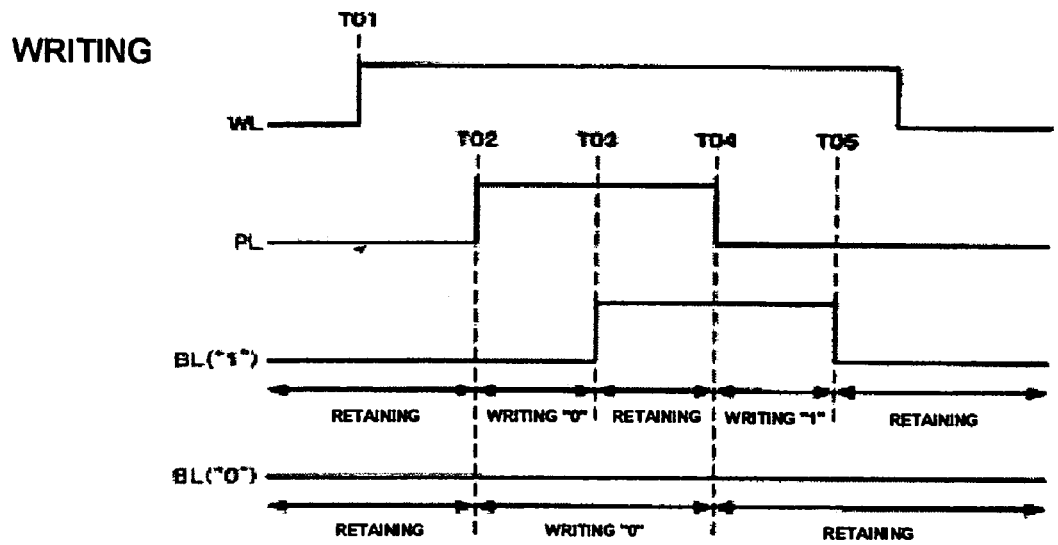
FIGS. 2A and 2B are timing charts for explaining write operations and read operations of a ferroelectric memory.

Exemplary embodiments of the invention are described below with reference to the accompanying drawings. It is noted that the embodiments described below do not in any way limit the contents of the claimed invention. Also, all compositions to be described in the embodiments may not necessarily be indispensable for the solutions that are provided by the invention.

1. Ferroelectric Memory

FIG. 1A shows an example of the structure of a memory cell of a ferroelectric memory. The memory cell includes a ferroelectric capacitor CS and an N-type (a first conductive type in a broad sense) transfer transistor TR. One end of the ferroelectric capacitor CS is connected to a node NC, and the other end thereof is connected to a plate line PL. The transfer transistor TR has a gate connected to a word line WL, a source connected to a bit line BL, and a drain connected to the node NC. It is noted that, in the present specification, one side of a current path of a transistor is called a drain, and the other side is called a source, for the sake of convenience. Furthermore, the memory cell is not limited to the structure shown in FIG. 1A. For example, the memory cell may not only be a 1T1C (1 Transistor 1 Capacitor) type, but also a 2T2C (2 Transistors 2 Capacitors) type, a FET type or the like.

As shown in FIG. 1B, when a logical "1" is written in the memory cell, a selection voltage is applied to the word line WL, a voltage of VCC (a second power source in a broader sense) is applied to the bit line BL, and 0V (the voltage of a first power supply in a broader sense) is applied to the plate line PL. As a result, as indicated by A1 in the hysteresis characteristic shown in FIG. 1C, the remanent polarization of the ferroelectric capacitor CS becomes "negative." The state in which the remanent polarization is "negative" can be defined as a state in which, for example, a logical "1" is stored.

On the other hand, when a logical "0" is written in the memory cell, a selection voltage is applied to the word line WL, 0V is applied to the bit line BL, and VCC (for example, 5V) is applied to the plate line PL. As a result, as indicated by A2 in the hysteresis characteristic shown in FIG. 1C, the remanent polarization of the ferroelectric capacitor CS becomes "positive." The state in which the remanent polarization is "positive" can be defined as a state in which, for example, a logical "0" is stored.

It is noted that the transfer transistor TR in FIG. 1A has a threshold value (VTH). Accordingly, when VCC is applied to the bit line BL and VCC is also applied to the word line WL, the voltage at the node NC assumes to be a voltage lower than VCC (VCC−VTH). For this reason, a sufficient voltage cannot be applied to the ferroelectric capacitor CS, which causes problems such as write errors and imprints. Accordingly, a voltage (VPP) higher than VCC may preferably be applied to the word line WL. It is clear from FIG. 1B that the phenomenon in which the voltage at the node NC is lowered by the influence of the threshold voltage becomes problematical only when a logical "1" is written in the memory cell by applying VCC to the bit line BL.

FIG. 2A shows an example of signal waveforms at the time of write operations to write in the memory cell. As shown in the figure, when a logical "1" is written in the memory cell, a logical "0" is written during a period T01–T03, and the logical "1" is written during a succeeding period T04–T05. When a logical "0" is written in the memory cell, the logical "0" is written during a period T02–T04.

Figure 2B:
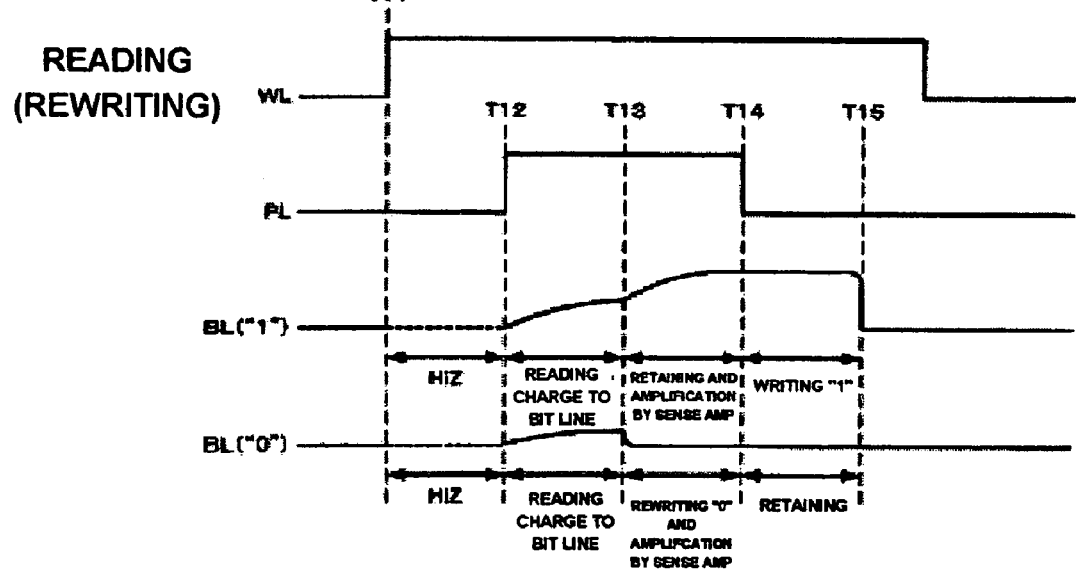

FIG. 2B shows an example of signal waveforms at the time of read operations to read from the memory cell. As shown in the figure, the bit line becomes to be a high impedance state (HiZ) during a period T11–T12, and a charge is transferred from the ferroelectric capacitor to the bit line during a period T12–T13. In a succeeding period T13–T14, an amplification operation to amplify the bit line voltage by a sense amplifier is conducted. Then, when data of a logical "1" has been read from the memory cell, rewriting of a logical "1" is conducted during a period T14–T15 to restore data that has been destroyed by the reading operation. On the other hand, when data of a logical "0" has been read from the memory cell, a bit line voltage amplification operation by a sense amplified is conducted and rewriting of a logical "0" is conducted during the period T13–T14.

As indicated by the periods T01–T05 and T14–T15 in FIG. 2B, a logical "1" is written after the potential on the plate line PL falls to 0V (non-active). Accordingly, even after the potential on the plate line PL falls to 0V, a selection voltage needs to be continuously applied to the word line WL for a predetermined period of time. In this case, as described above with reference to FIG. 1A, unless the selection voltage on the word line WL is set to a high voltage, the voltage at the node NC is lowered by the threshold voltage of the transfer transistor TR. Therefore, at least during the period T01–T05 or T14–T15, the selection voltage on the word line WL may preferably be set to a high voltage (VPP).

2. Overall Structure

Figure 3:
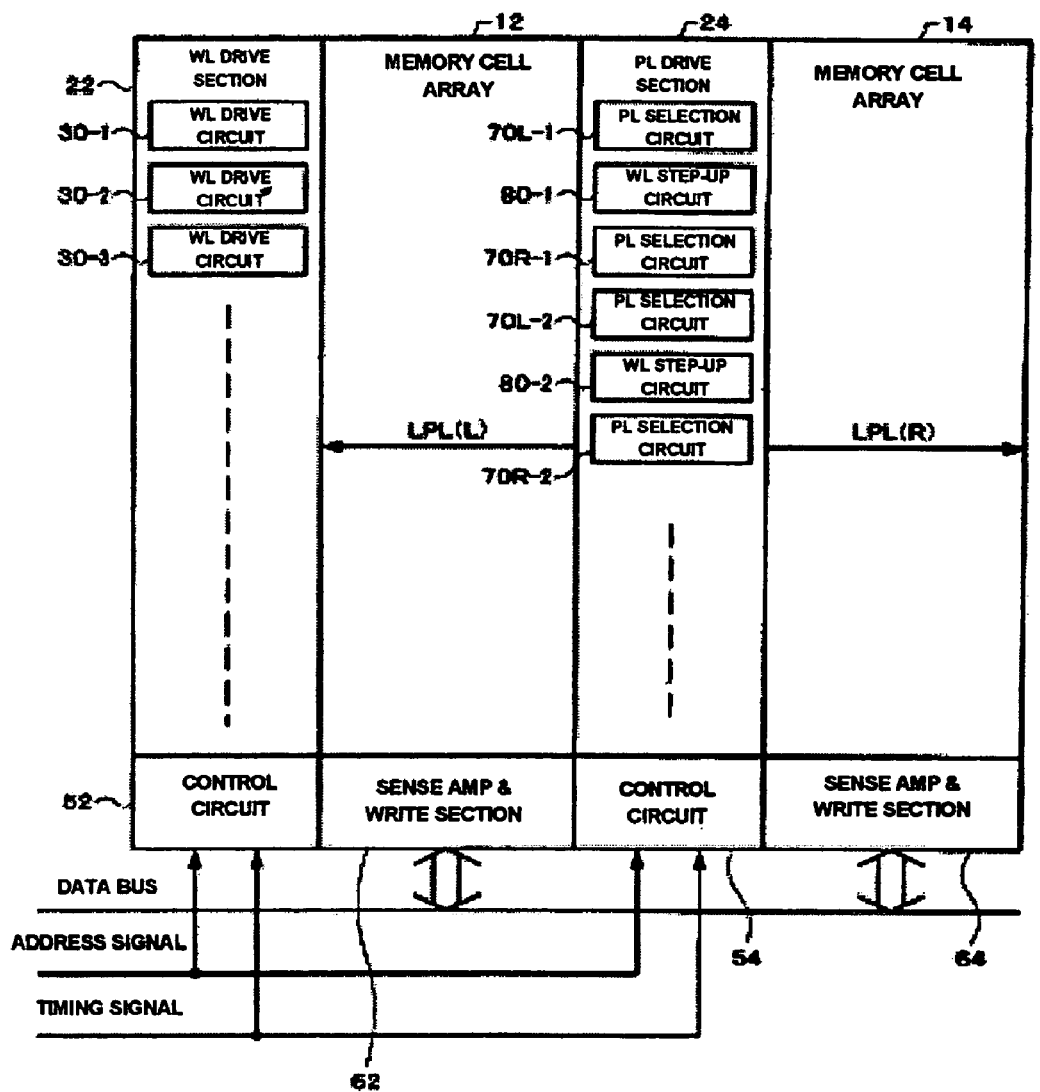
FIG. 3 shows an example of the structure of a ferroelectric memory.

FIG. 3 shows an overall structure of a ferroelectric memory (a semiconductor memory device) in accordance with an embodiment of the present invention. It is noted that the ferroelectric memory of the present embodiment is not limited to the structure shown in FIG. 3, but may have a structure in which a portion of the components thereof is omitted or a structure in which other components are added.

The ferroelectric memory shown in FIG. 3 includes memory cell arrays 12 and 14, which define two divided blocks (a plurality of blocks in a broader sense). Each of the memory cell arrays 12 and 14 includes a plurality of memory cells with ferroelectric capacitors arranged therein. More concretely, as shown in FIG. 1A, each of the memory cells includes a ferroelectric capacitor, and a transfer transistor that is connected to one end of the ferroelectric capacitor. In the case of a 2T2C type memory cell, the memory cell includes a first ferroelectric capacitor that stores either a logical "0" or a logical "1," a first transfer transistor that is connected to one end of the first ferroelectric capacitor, a second ferroelectric capacitor that stores either a logical "0" or a logical "1," and a second transfer transistor that is connected to one end of the second ferroelectric capacitor. In addition to the memory cell array, an array of reference cells (dummy memory cells) for generating a reference voltage for a sense amplifier may be provided.

The ferroelectric memory includes a plurality of word lines, a plurality of plate lines, and a plurality of bit lines. It is noted that, in the present specification, a "word line," a "plate line (local plate line)," and a "bit line" may be called a "WL," a "PL (LPL)," and "BL," respectively, if appropriate. Each word line (K-th word line) among the plural word lines is connected to gates of the transfer transistors of the corresponding memory cells. Each bit line among the plural bit lines is connected to one ends of the corresponding ferroelectric capacitors through sources or drains of the corresponding transfer transistors. Each plate line (K-th plate line) among the plural plate lines is connected to the other ends of the corresponding capacitors.

The ferroelectric memory includes a WL drive section 22 and a PL drive section 24 (drive sections in a broader sense). The WL drive section 22 performs, for example, decoding of address signals and driving of the word lines. The PL drive section 24 performs, for example, driving of the plate lines and selection of the plate lines (local plate lines). More concretely, for example, the WL drive section 22 that is provided on the left side (or may be provided on the right side) drives the word lines, and the PL drive section 24 that receives signals from the word lines drives the plate lines (local plate lines LPL(L)) of the memory cell array 12 on the left side and the plate lines (local plate lines LPL(R)) of the memory cell array 14 on the right side.

The WL drive section 22 includes a plurality of WL drive circuits 30-1, 30-2, 30-3, . . . , etc. Each of the WL drive circuits 30-1, 30-2, 30-3, . . . , etc. drives each of the word lines.

The PL drive section 24 includes a plurality of PL selection circuits 70L-1, 70R-1, 70L-2, 70R-2, . . . , etc., and a plurality of WL step-up circuits 80-1, 80-2, . . . , etc. Each of the PL selection circuits 70L-1, 70R-1, 70L-2, 70R-2, . . . , etc. selects a plate line (local plate line), and supplies a plate line selection signal to the selected plate line. Also, each of the WL step-up circuits 80-1, 80-2, . . . , etc. steps up the voltage on each of the word lines.

The ferroelectric memory includes ferroelectric memory control circuits 52 and 54. The control circuits 52 and 54 receive address signals (X address signals and Y address signals) and various timing signals (WL timing signals, PL timing signals, etc.), generate various control signals (WL selection signals, PL selection signals, step-up control signals, WL control signals, PL control signals, etc.), and supply them to the WL drive section 22, the PL drive section 24, and sense amplifier and write sections 62 and 64.

The sense amplifier and write sections 62 and 64 control the bit lines, and perform data read operations and write (rewrite) operations. More concretely, for example, at the time of reading data, each of them amplifies the voltage on a bit line by a sense amplifier, and compares the voltage with a reference voltage, thereby judging whether the data read from a memory cell is a logical "1" or "0." Also, when data from a data bus is to be written, the voltage on a bit line is set to VCC or 0V, thereby writing a logical "1" or "0" in a memory cell.

Figure 4:
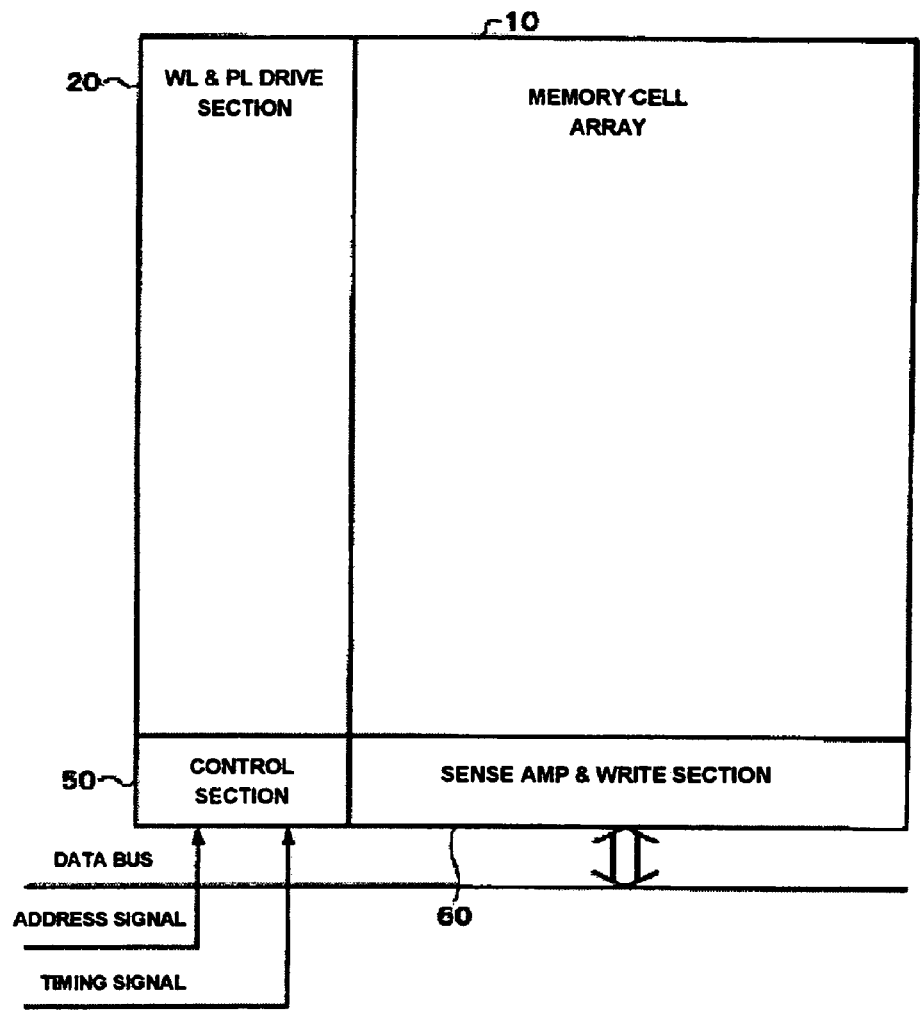
FIG. 4 shows an example of the structure of a ferroelectric memory.

The memory cell array shown in FIG. 3 is divided into two blocks, but may be divided into three or more blocks. Also, a variety of modifications can be made in the structure of the ferroelectric memory without being limited to the structure shown in FIG. 3, and for example, a structure shown in FIG. 4 is possible. In FIG. 4, a WL & PL drive section 20 that realizes both of the functions of the WL drive section 22 and the PL drive section 24 is arranged on the left side (alternatively, on the right side) of the memory cell array 10. The WL & PL drive section 20 performs driving of the word lines and driving (selection) of the plate lines.

3. Comparison Example

Figure 5:
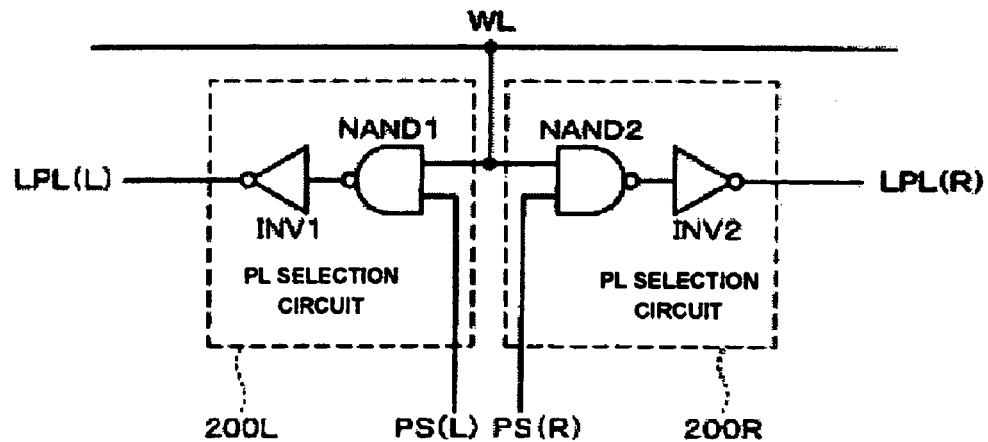
FIG. 5 shows an example of the structure of a comparison example.

FIG. 5 shows an example of PL selection circuits 200L and 200R, which is an example for comparison with the present embodiment. The PL selection circuit 200L includes a NAND circuit NAND1 and an inverter circuit INV1, and the PL selection circuit 200R includes a NAND circuit NAND2 and an inverter circuit INV2. When the word line WL is set to a selection voltage (VCC), and the PL selection signal PS(L) is set to the selection voltage (VCC), an output of the NAND1 becomes to be a L (low) level, and a H (high) level is supplied to the plate line (local plate line) LPL(L) from INV1. By this, data is written in or read from a memory cell with a ferroelectric capacitor having one end connected to the plate line LPL(L). Also, when the word line WL is set to a selection voltage, and the PL selection signal PS(R) is set to the selection voltage (VCC), an output of the NAND2 becomes to be a L level, and a H level is supplied to the plate line (local plate line) LPL(R) from INV2. By this, data is written in or read from a memory cell with a ferroelectric capacitor having one end connected to the plate line LPL(R).

However, the comparison example shown in FIG. 5 requires many logic circuits (NAND1, NAND2, INV1, and INV2), which makes the PL selection circuit larger and more complex. This leads to problems in that the ferroelectric memory becomes larger, and power consumption reduction is prevented because there are many PL selection circuits. Also, the comparison example in FIG. 5 does not perform a word line voltage step-up based on a signal from a plate line.

4. PL Selection Circuit, WL Step-up Circuit

Figure 6:
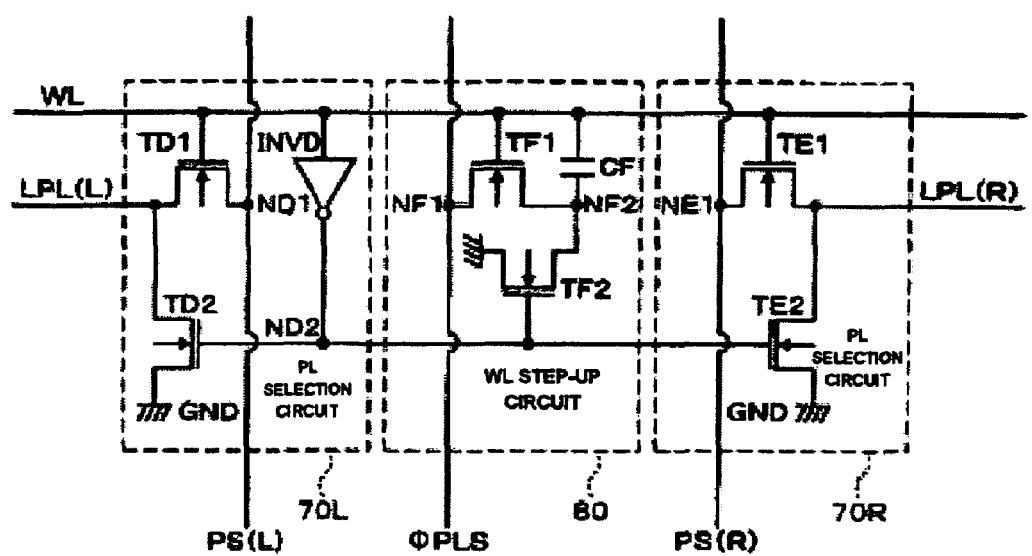
FIG. 6 shows examples of the structures of a PL selection circuit and a WL step-up circuit in accordance with an embodiment of the present invention.

FIG. 6 shows an example of the structure of PL selection circuits 70L and 70R and a WL step-up circuit 80 in accordance with an embodiment, which can solve the problems described above. It is noted that the PL selection circuits and WL step-up circuit in accordance with the present embodiment are not limited to the structure shown in FIG. 6, and may have a structure in which a part of the components thereof is omitted or a structure in which other components are added.

The PL selection circuit 70L (L-th PL selection circuit: L is an integer) includes N-type (first conductive type) transistors TD1 and TD2 (first and second transistors).

The transistor TD1 is provided between a plate line LPL(L) (L-th plate line) and a supply node ND1 for supplying a PL selection signal PS(L) (I-th plate line selection signal: I is an integer). More concretely, the transistor TD1 has a source connected to the supply node ND1, a gate connected to a word line WL, and a drain connected to the plate line LPL(L).

The transistor TD1 turns on when the word line WL (K-th word line: K is an integer) is set to a selection voltage (VCC, VPP), thereby supplying a PL selection signal PS(L) to the plate line LPL(L). More concretely, when the word line WL is set to a voltage level of VCC (second power supply), and the PL selection signal PS(L) is 0V, the plate line LPL(L) remains to be 0V. On the other hand, when the word line WL is set to VCC, and the PL selection signal PS(L) is VCC, the plate line LPL(L) is set to VCC−VTD1 (where VTD1 is a threshold voltage of the transistor TD1). By this, data is written in or read from a memory cell with a ferroelectric capacitor having one end connected to the plate line LPL(L).

The transistor TD2 is provided between the plate line LPL(L) and GND (first power supply in a broader sense). More concretely, the transistor TD2 has a source connected to the GND, a gate connected to an output node ND2 of an inverter circuit INVD, and a drain connected to the plate line LPL(L). The transistor TD2 turns on when the word line WL is set to a non-selection voltage (0V), and the output node ND2 of the inverter circuit INVD becomes VCC, whereby the plate line LPL(L) is set to a voltage level of the GND (first power supply), which is 0V. In other words, unless the word line WL is set to a selection voltage, the plate line LPL(L) is set to 0V (GND) by the transistor TD2.

Also, the PL selection circuit 70L includes an inverter circuit INVD that receives a signal inputted from the word line WL and outputs its inverted signal. The inverter circuit INVD is shared by the PL selection circuit 70L, the PL selection circuit 70R and the WL step-up circuit 80. In other words, an output of the inverter circuit INVD is inputted in a gate of the transistor TD2 of the PL selection circuit 70L, a gate of a transistor TE2 of the PL selection circuit 70R and a gate of a transistor TF2 of the WL step-up circuit 80.

The PL selection circuit 70R (M-th PL selection circuit: M is an integer) includes N-type (first conductive type) transistors TE1 and TE2 (third and fourth transistors).

The transistor TE1 is provided between a plate line LPL(R) (M-th plate line) and a supply node NE1 for supplying a PL selection signal PS(R) (J-th plate line selection signal: J is an integer). More concretely, the transistor TE1 has a source connected to the supply node NE1, a gate connected to the word line WL, and a drain connected to the plate line LPL(R)

The transistor TE1 turns on when the word line WL is set to a selection voltage, thereby supplying a PL selection signal PS(R) to the plate line LPL(R). More concretely, when the word line WL is set to VCC, and the PL selection signal PS(R) is 0V, the plate line LPL(R) remains to be 0V. On the other hand, when the word line WL is set to VCC, and the PL selection signal PS(R) is VCC, the plate line LPL(R) is set to VCC−VTE1 (VTE1 is a threshold voltage of the transistor TE11). By this, data can be written in or read from a memory cell with a ferroelectric capacitor having one end connected to the plate line LPL(R).

Also, the transistor TE2 is provided between the plate line LPL(R) and GND. More concretely, the transistor TE2 has a source connected to GND, a gate connected to an output node ND2 of the inverter circuit INVD and a drain connected to the plate line LPL(R). The transistor TE2 turns on, when the word line WL is set to a non-selection voltage (0V) and the output node ND2 of the inverter circuit INVD becomes VCC, thereby setting (discharging) the plate line LPL(R) to 0V. In other words, unless the word line WL becomes the selection voltage, the plate line LPL(R) is set to 0V by the transistor TE2.

The WL step-up circuit 80 (K-th word line step-up circuit) includes a step-up capacitor CF and N-type transistors TF1 and TF2.

The step-up capacitor CF has one end connected to the word line WL and the other end connected to a first node NF2. It is noted that the capacitor CF can be a paraelectric capacitor or a ferroelectric capacitor.

The transistor TF1 (fifth transistor) is provided between a supply node NF1 of a step-up control signal ΦPLS and the node NF2. More concretely, the transistor TF1 has a source connected to the supply node NF1, a gate connected to the word line WL, and a drain connected to the node NF2. The transistor TF1 turns on when the word line WL is set to a selection voltage, thereby supplying the step-up control signal ΦPLS to the node NF2. Then, when the step-up control signal ΦPLS changes from 0V (non-active) to VCC (active), the voltage on the word line WL is stepped up (to VPP) through capacitive coupling of the step-up capacitor CF. By this, the gate voltages of the transistors TD1 and TE1 rise, such that the voltage levels on the plate lines LPL(L) and LPL(R) are set to VCC.

The place where the WL step-up circuit 80 is to be arranged is not limited to a location between the PL selection circuits as in FIG. 6, but can be arranged at any arbitrary location where it can be connected to the word line WL. For example, the WL step-up circuit 80 may be disposed, for example, in the area of the PL drive section 24 shown in FIG. 3, or the WL step-up circuit 80 may be disposed in the area of the WL drive section 22.

Figure 7:
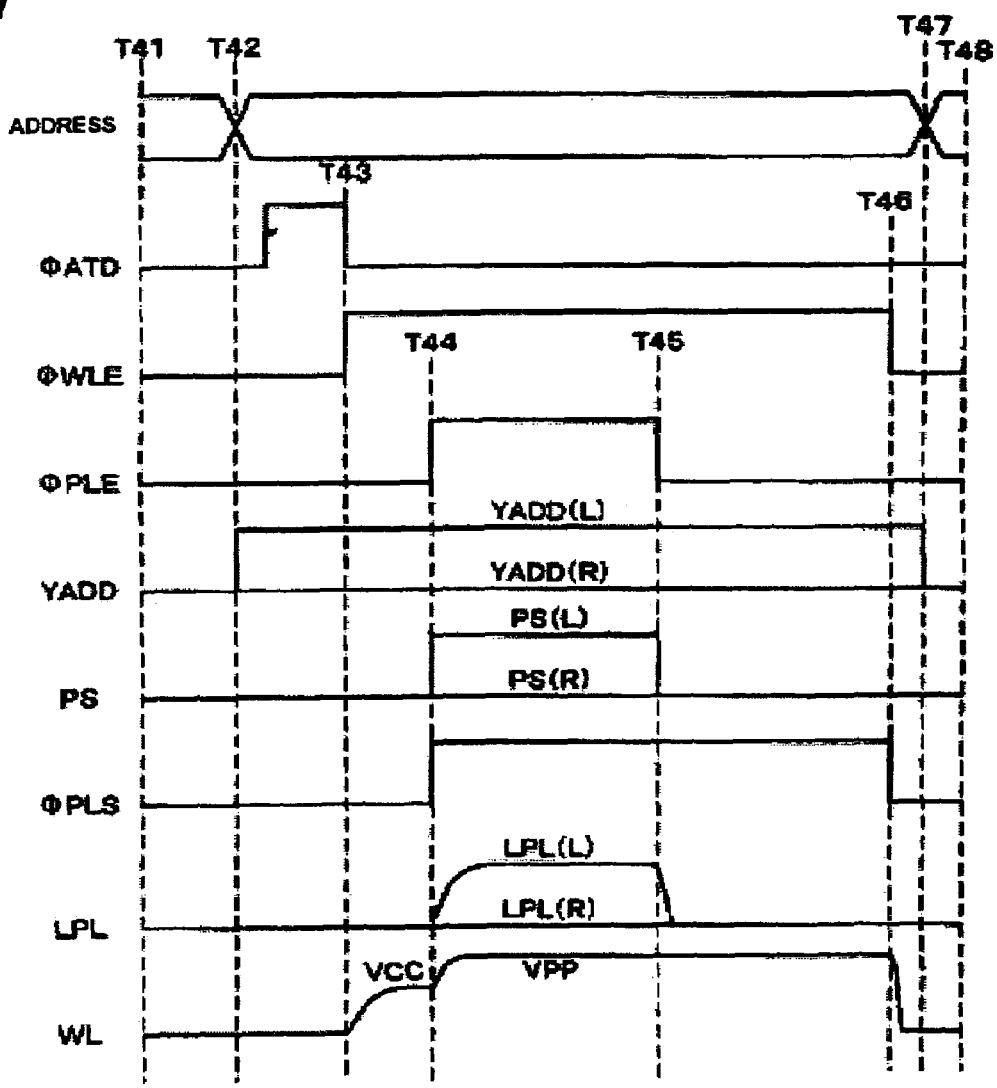
FIG. 7 shows a signal waveform chart for describing operations of the PL selection circuit and the WL step-up circuit in accordance with the embodiment of the present invention.

Next, operations of the present embodiment are described by using a signal waveform chart in FIG. 7. When an address changes at timing T42, an address transition detection signal ATD becomes active. At this moment, a Y address signal is YADD(L) in FIG. 7. Accordingly, the plate line LPL(L) side (the memory cell array 12 side in FIG. 3) becomes to be a selected state, and the plate line LPL(R) side (the memory cell array 14 side) becomes to be a non-selected state.

When a WL timing signal ΦWLE becomes active (VCC, high level) at timing T42, and the word line WL is selected, the voltage on the word line WL is set to VCC. Then, when a PL timing signal ΦPLE becomes active at timing T44, a PL selection signal PS becomes active. More concretely, because the plate line LPL(L) side is in a selected state in FIG. 7, the PL selection signal PS(L) changes from non-active (0V) to active (VCC), and the PL selection signal PS(R) remains to be non-active (0V). At this moment, because the transistor TD1 in FIG. 6 is on, the voltage on the plate line LPL(L) rises.

Also, when the PL timing signal ΦPLE becomes active at timing T44, the step-up control signal ΦPLS becomes active. Accordingly, the word line WL is stepped up from VCC to VPP by capacitive coupling of the step-up capacitor CF in FIG. 6. Consequently, as the voltage VPP that is higher than VCC is applied to the gate of the transistor TD1 (TE1), the voltage on the plate line LPL(L) is set to VCC, not to VCC−VTD1.

Next, as the PL timing signal ΦPLE becomes non-active (0V) at timing T45, the voltage on the plate line LPL(L) returns to 0V. On the other hand, at this timing T45, the step-up control signal ΦPLS remains to be active. In other words, as the step-up control signal ΦPLS is active during a period T44–T46, the voltage on the word line WL is also set to a step-up voltage VPP during the period T44–T46. By this, writing of a logical "1" can be properly conducted during the period T04–T05 shown in FIG. 2A.

The PL selection circuit and the step-up circuit in accordance with the present embodiment can exhibit the following actions and effect.

(1) Compared to the comparison example that uses NAND circuits and inverter circuits shown in FIG. 5, the number of transistors that compose the circuit can be considerably reduced, and the circuit arranging area can also be reduced. In other words, the total number of transistors that compose the PL selection circuits 200L and 200R in the comparison example in FIG. 5 is twelve. In contrast, the total number of transistors composing the PL selection circuits 70L and 70R of the present embodiment in FIG. 6 is six, including two transistors that compose the inverter circuit INVD, which is considerably fewer than that of the comparison example. Also, the inverter circuit INVD can be shared by the WL step-up circuit, such that the circuit area can be made much smaller.

(2) During the period when the step-up control signal ΦPLS is active, the voltage on the word line WL can be set to a step-up voltage VPP, such that, in particular, writing of a logical "1" can be sufficiently conducted.

In other words, as described with reference to FIG. 2A, a logical "1" is written in a memory cell during the period T04–T05 after the voltage on the plate line PL falls, and therefore the word line voltage is desirably stepped up during this period T04–T05.

In the present embodiment, because the step-up control signal ΦPLS that is independent from the PL timing signal ΦPLE is used, the step-up control signal ΦPLS can be maintained to be active even after the signal ΦPLE becomes non-active at timing T45 in FIG. 7. Accordingly, because the word line WL can be set to a step-up voltage VPP even after timing T45, writing of a logical "1" can be sufficiently conducted.

(3) The word line WL is stepped up to VPP, and the step-up voltage VPP is inputted in the gates of the transistors TD1 and TE1, such that the voltage on the plate lines LPL(L) and LPL(R) can be set to VCC that is higher than VCC−VTD1 or VCC−VTE1.

(4) The signal lines for the PL selection signals PS(L) and PS(R) are connected to the drains of the transistors TD1 and TE1, not to their gates, and the signal line for the step-up control signal ΦPLS is also connected to the drain of the transistor TF1, not to its gate. Accordingly, the parasitic capacitance (load) of these signal lines can be reduced, such that such problems as blunting of signal waveforms can be solved. Also, charge or discharge currents on these signal lines are reduced, such that power saving can be achieved.

In other words, in the comparison example in FIG. 5, because the signal lines for the PL selection signals PS(L) and PS(R) are connected to the gates of the transistors that compose the NAND circuits, the parasitic capacitance of the signal lines become considerably large. For this reason, the transistor size of the circuit that drives these signal lines needs to be enlarged, which causes a problem in that the circuit becomes larger. Also, charge or discharge currents on the signal lines become greater, which causes a problem in that the power consumption increases. According to the present embodiment, the problems described above can be solved.

A voltage (word line voltage) that is the same as the voltage that is applied to the gate of the transfer transistor (TR in FIG. 1A) that composes the memory cell is applied to the gates of the transistors TD1 and TE1. Therefore, a ferroelectric memory that is difficult to cause an imprint can be provided. For example, when the word line voltage is VCC, the gate voltage of the transistor TD1 in FIG. 6 and the gate voltage of the transfer transistor TR in FIG. 1A are both VCC. In this state, when the PL selection signal becomes VCC, the plate line voltage becomes to be VCC−VTD1. On the other hand, in FIG. 1A, when the bit line voltage becomes VCC, the voltage at the node NC becomes VCC−VTH. Accordingly, the voltage that is applied to the node NC at one end of the ferroelectric capacitor CS and the voltage that is applied to the plate line at the other end thereof shift to the same direction, such that a ferroelectric memory that is difficult to cause an imprint can be provided.

(6) The voltage is applied only to a plate line that is selected by the word line WL and the PL selection signal PS, and the other plate line is grounded to 0V by the transistors TD2 and TE2. Accordingly, stored data in a non-selected memory cell can be prevented from being destroyed by signal noise on the plate lines.

(7) When the word line voltage falls to 0V, the transistor TF2 of the WL step-up circuit 80 turns on, and the voltage at the node NF2 changes toward 0V. Accordingly, the word line voltage can be made to fall at high speed by using capacitive coupling of the step-up capacitor CF. This realizes high speed operations of the circuit.

Figure 8:
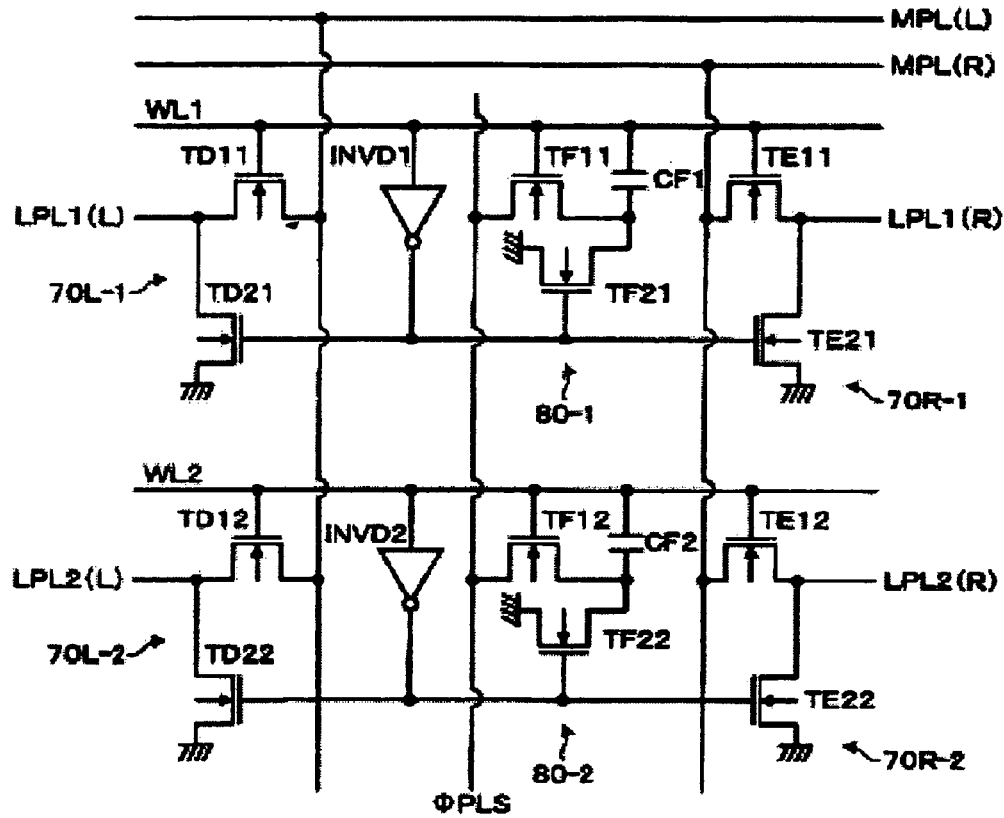
FIG. 8 shows a diagram for describing wirings of a main PL selection signal line.

(8) By wiring the PL selection signal lines PS in parallel with the bit lines BL, and also by wiring the main PL selection signal lines MPL in parallel with the word lines WL, as shown in FIG. 8, the plate lines can be hierarchized. In this case, in accordance with the present embodiment, a main PL selection signal line can be shared by adjacent ones of the PL selection circuits (a PL selection circuit for the K-th word line and a PL selection circuit for the (K+1)-th word line). In other words, in FIG. 8, the main PL selection signal line MPL(L) can be shared by the PL selection circuits 70L-1 and 70L-2, and the main PL selection signal line MPL(R) can be shared by the PL selection circuits 70R-1 and 70R-2. By this, the number of circuits to be arranged for driving the main PL selection signal lines can be reduced, and therefore the circuit size can be reduced.

5. Modified Examples

Figure 9:
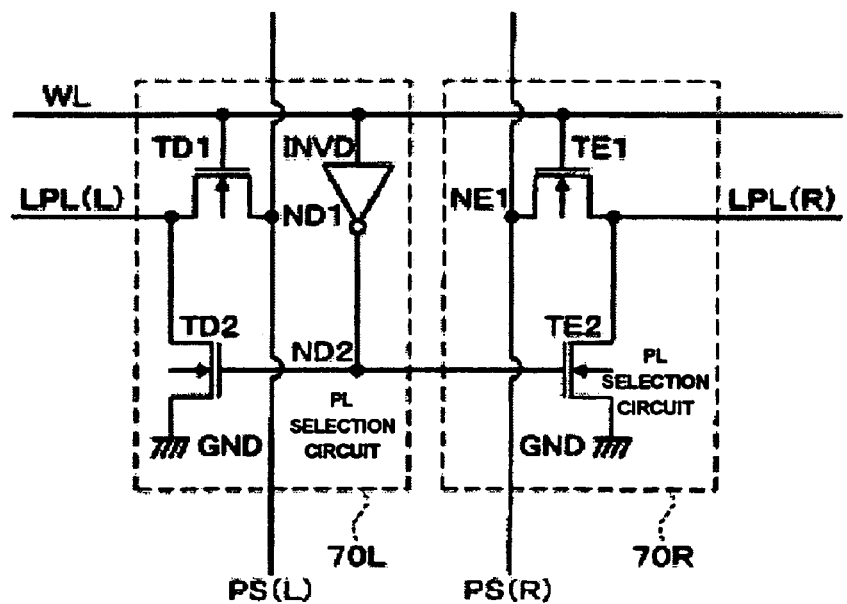
FIG. 9 shows a first modified example of the present embodiment.

FIG. 9 shows a first modified example of the present embodiment. In FIG. 9, although PL selection circuits 70L and 70R are provided, a WL step-up circuit 80 shown in FIG. 6 is not provided. In the first modified example shown in FIG. 9, an inverter circuit INVD that generates an inversion signal of a WL signal is shared by the PL selection circuits 70L and 70R.

Figure 10A:
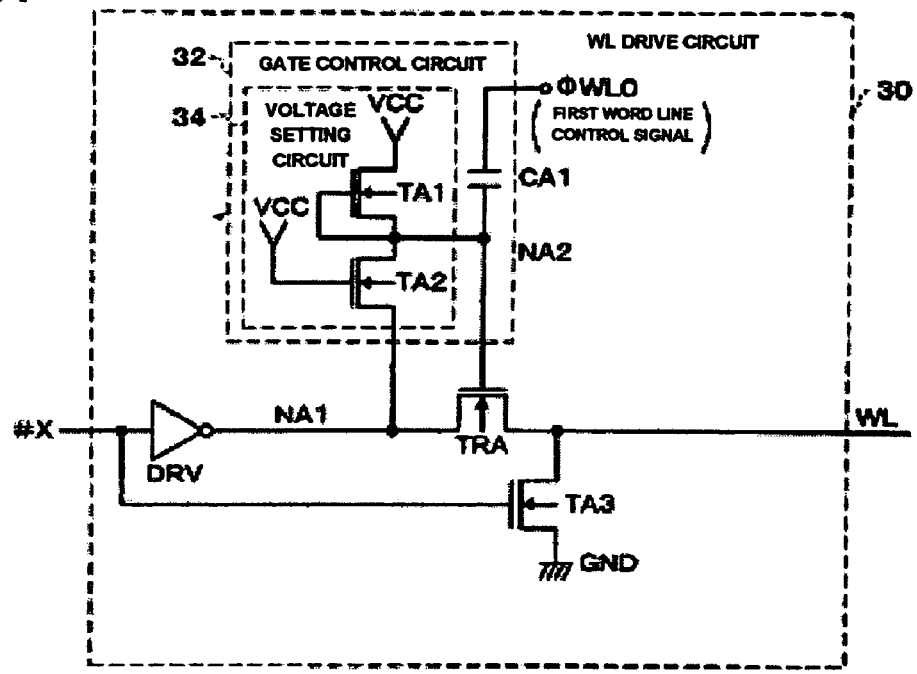
FIGS. 10A and 10B show examples of the structures of WL driving circuits.

For example, FIG. 10A shows an example of the structure of a WL drive circuit 30 (the K-th WL drive circuit). The WL drive circuit 30 includes a driver DRV, a transfer transistor TRA and a gate control circuit 32. The driver DRV is a circuit that drives the word line WL. The N-type transfer transistor TRA, which is provided between the driver DRV and the word line WL, has a gate that is controlled by the gate control circuit 32, for performing on/off control of connection between a drive node NA1 and the word line WL. The gate control circuit 32 is a circuit that performs gate control of the transfer transistor TRA, and includes a voltage setting circuit 34 and a step-up capacitor CA1.

When an address decode signal #X is non-active (VCC), an N-type transistor TA3 turns on, and the word line WL is discharged to 0V. It is noted that "#" indicates a negative logic. When the address decode signal #X becomes 0V, and the word line WL is selected, the voltage at the drive node NA1 becomes VCC. By this, a gate node NA2 of the transfer transistor TRA is set to a first voltage level VCC−VTA2 (VTA2 is a threshold voltage of the transistor TA2).

Next, when a word line control signal ΦWL0 becomes active (VCC), the voltage at the gate node NA2 rises due to capacitive coupling of a capacitor CA1 for gate control. At this time, the voltage at the gate node NA2 is clamped by a transistor TA1 that functions as a clamp circuit at a second voltage level VCC+VTA1 (VTA1 is a threshold voltage of the transistor TA1). As a result of the gate node NA2 being set to VCC+VTA1, the transfer transistor TRA strongly turns on, whereby the word line WL is driven by the driver DRV and the word line voltage rises to VCC.

Then, when the word line control signal ΦWL0 becomes non-active (0V), the gate node NA2 is set by capacitive coupling of the gate control capacitor CA1 to a third voltage level VCC−α (α>VTA, where VTA is a threshold voltage of the TRA) that turns off the transfer transistor TRA.

According to the circuit shown in FIG. 10A, the transfer transistor TRA is controlled to turn on and off by the gate control circuit 32, whereby the connection between the driver DRV and the word line WL can be arbitrarily shut off. By turning off the transfer transistor TRA to thereby shut off the connection between the driver DRV and the word line WL, the word line WL is set to a high-impedance state, whereby the stepping up of the word line voltage is facilitated.

Figure 10B:
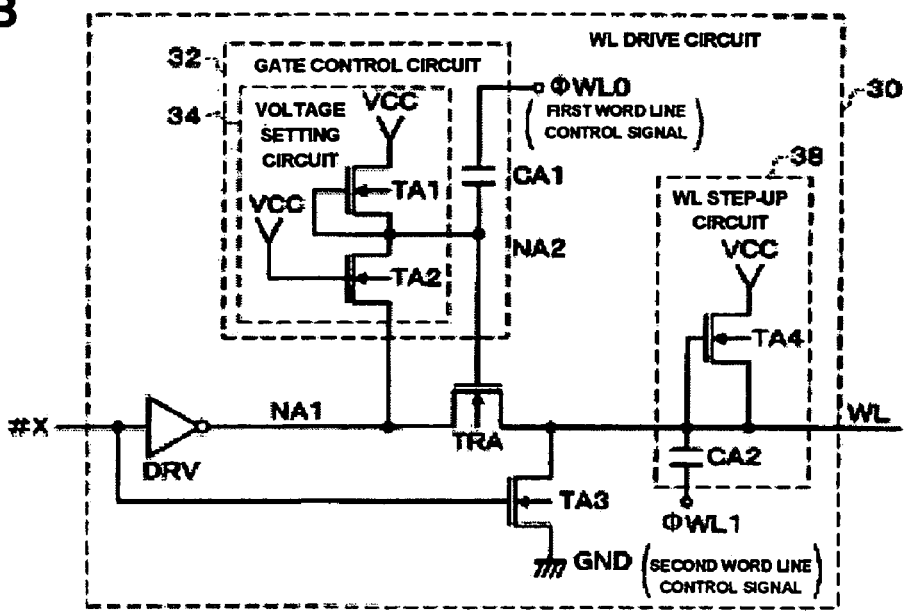

On the other hand, in FIG. 10B, the WL drive circuit 30 includes a WL step-up circuit 38. The WL step-up circuit 38 is a circuit that performs a step-up operation to step up the voltage on the word line WL, and steps up the voltage on the word line when a second word line control signal ΦWL1 becomes active (VCC). The WL step-up circuit 38 includes a voltage step-up capacitor CA2 having one end to which the word line control signal ΦWL1 is supplied and the other end that is connected to the word line WL. After the transfer transistor TRA has turned off and the word line has been placed in a high-impedance state, and when the word line control signal ΦWL1 becomes active, the word line WL is stepped up to VPP by capacitive coupling of the capacitor CA2. At this moment, the voltage on the word line WL is clamped by a transistor TA4 that functions as a clamp circuit to a voltage level VCC+VTA4 (VTA4 is a threshold voltage of the transistor TA4).

When the WL drive circuit 30 includes the WL step-up circuit 38 as shown in FIG. 10B, the WL step-up circuit 80 shown in FIG. 6 becomes unnecessary. Accordingly, in this case, it is desirous to use the first modified example shown in FIG. 9 that does not include a WL step-up circuit.

Figure 11:
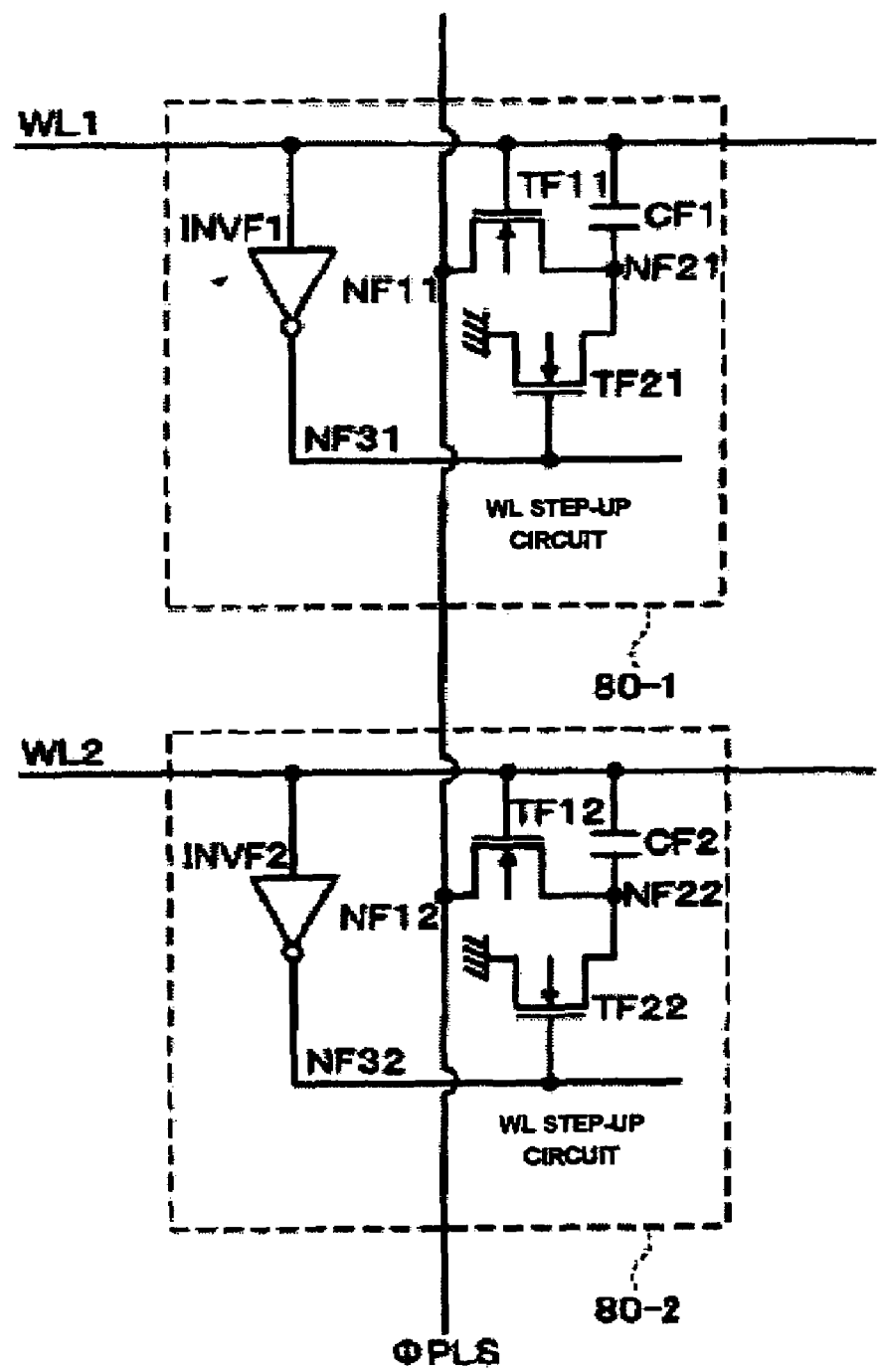
FIG. 11 shows a second modified example of the present embodiment.

FIG. 11 shows a second modified example of the present embodiment. In FIG. 11, WL step-up circuits 80-1 and 80-2 are provided, but PL selection circuits 70L and 70R, shown in FIG. 6, are not provided. More specifically, the second modified example is provided with the WL step-up circuit WL80-1 for a word line WL1 and the WL step-up circuit 80-2 for a word line WL2. The other word lines are similarly arranged.

After the transfer transistor TRA in FIG. 10A has turned on and the word line WL1 has been driven, and when the transfer transistor TRA turns off, the word line WL1 is set to a high impedance state. Then, when a step-up control signal ΦPLS in FIG. 11 becomes active (VCC), the voltage on the word line WL1 that is set to a high impedance state is stepped up by the WL step-up circuit 80-1. When the word line voltage is stepped up in this manner, a step-up voltage VPP that is higher than VCC is applied to the gate of the transfer transistor TR in FIG. 1A. By this, at the time of selecting the word line, the voltage at the node NC in FIG. 1A can be set to VCC that is higher than VCC−VTH. Accordingly, a sufficient voltage can be applied to the ferroelectric capacitor CS, such that proper writing of data can be achieved.

Further, in the circuit in FIG. 11, when the voltage on the word line WL1 changes from VPP to 0V, the transistor TF21 changes from its off state to an on state, whereby a node NF21 changes toward 0V. Accordingly, by using capacitive coupling of a capacitor CF1 for voltage step-up control, the voltage on the word line WL1 can be rapidly changed from VPP to 0V.

6. Signal Generation Circuit

Figure 12:
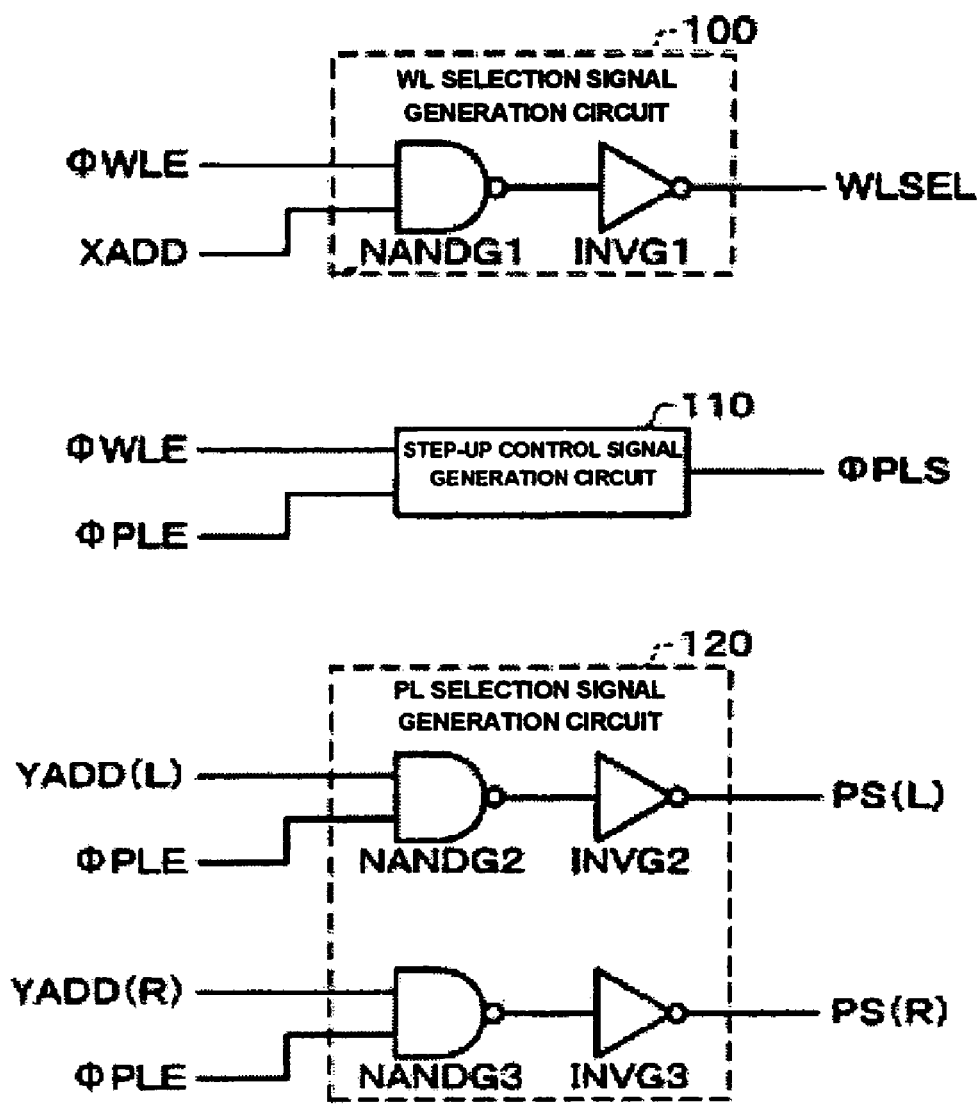
FIG. 12 shows examples of the structures of signal generation circuits that generate various signals, respectively.

FIG. 12 shows examples of circuits that generate various kinds of signals that are used in the present embodiment. A WL selection signal generation circuit 100 in FIG. 12 is included in the control circuit 52 in FIG. 3, and a step-up control signal generation circuit 110 and a PL selection signal generation circuit 120 are included in the control circuit 54.

The WL selection signal generation circuit 100 includes a NAND circuit NANDG1 and an inverter circuit INVG1, and generates a WL selection signal WLSEL based on a WL timing signal ΦWLE and an X address signal XADD.

The step-up control signal generation circuit 110 generates a step-up control signal ΦPLS in FIG. 6 and FIG. 7 based on the WL timing signal ΦWLE and a PL timing signal ΦPLE.

The PL selection signal generation circuit 120 includes NAND circuits NANDG2 and NANDG3, and inverter circuits INVG2 and INVG3. The PL selection signal generation circuit 120 generates a PL selection signal PS(L) based on a Y address signal YADD(L) and a PL timing signal ΦPLE, and generates a PL selection signal PS(R) based on a Y address signal YADD(R) and the PL timing signal ΦPLE.

Figure 13A:
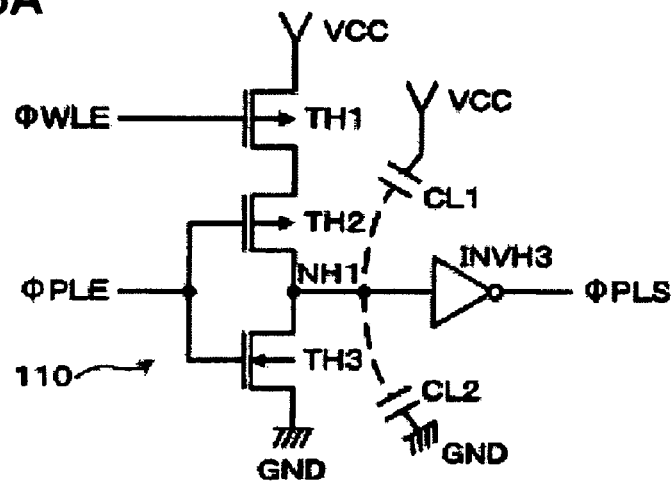
FIGS. 13A and 13B are an example of the structure of a step-up control signal generation circuit and a signal waveform diagram for describing its operations.
Figure 13B:
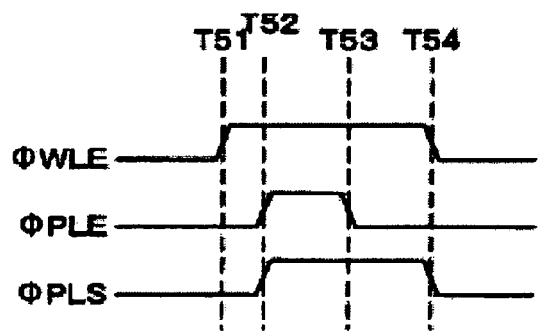

FIG. 13A shows a first example of the structure of the step-up control signal generation circuit 110 in FIG. 12, and FIG. 13B shows a signal waveform chart for describing operations thereof.

The step-up control signal generation circuit 110 in FIG. 13A includes P-type transistors TH1 and TH2 and an N-type transistor TH3 that are connected in series between VCC (second power supply) and GND (first power supply). A WL timing signal ΦWLE is inputted in the gate of the transistor TH1, and a PL timing signal ΦPLE is inputted in the gates of the transistors TH2 and TH3. Further, an input of the inverter circuit INVH3 is connected to an output node NH1 that commonly connects to the drains of the transistors TH2 and TH3. It is noted that the WL timing signal ΦWLE is a signal for setting the timing of an WL selection signal, etc., and the PL timing signal ΦPLE is a signal for setting the signal change timing of the PL selection signals PS(L) and PS(R).

After the signal ΦWLE has become active (VCC) at timing T51 in FIG. 13B, and the transistor TH1 has turned off, and when the signal ΦPLE becomes active (VCC) at timing T52, the transistor TH3 turns on. By this, the voltage at the node NH1 changes to 0V, and the step-up control signal ΦPLS becomes active (VCC).

Then, when the signal ΦPLE becomes non-active (0V) at timing T53, the transistor TH3 turns off and the transistor TH2 turns on, but the transistor TH1 remains to be turned off. For this reason, the voltage at the node NH1 is maintained at 0V by parasitic capacitances CL1 and CL2, and the voltage level of the signal ΦPLS does not change and is maintained at VCC. Then, when the signal ΦWLE becomes non-active (0V) at timing T54, the transistor TH1 turns on, and the voltage at the node NH1 becomes VCC, such that the signal ΦPLS becomes non-active (0V).

Figure 14A:
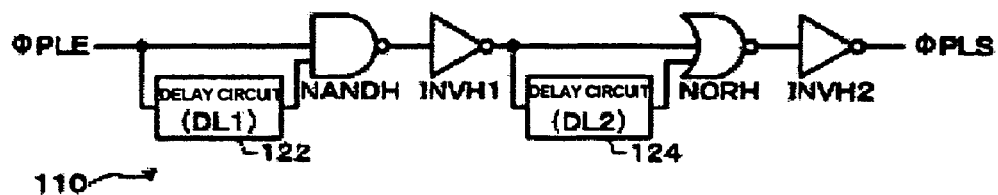
FIGS. 14A and 14B are an example of the structure of a step-up control signal generation circuit and a signal waveform diagram for describing its operations.
Figure 14B:
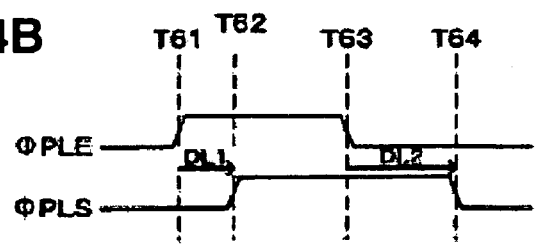

FIG. 14A shows a second example of the structure of the step-up control signal generation circuit 110 in FIG. 12, and FIG. 14B shows a signal waveform chart for describing operations thereof. The step-up control signal generation circuit 100 includes delay circuits 122 and 124, a NAND circuit NANDH, a NOR circuit NORH, and inverter circuits INVH1 and INVH2.

When the signal ΦPLE becomes active (VCC) at timing T61 in FIG. 14B, the signal ΦPLS becomes active (VCC) at timing T62 after a delay time DL1 that is determined by an element delay of the delay circuit 122 has elapsed. Then, when the signal ΦPLE becomes non-active (0V) at timing T63, the signal ΦPLS becomes non-active (0V) at timing T64 after a delay time DL2 that is determined by an element delay of the delay circuit 124 has elapsed.

According to the step-up control signal generation circuits 110 in FIG. 13A and FIG. 14A, the step-up control signal ΦPLS is set to be active (VCC) for a predetermined period of time after the PL timing signal ΦPLE becomes non-active (0V) from an active state (VCC). In other words, during a period T53–T54 in FIG. 13B and during a period T63–T64 in FIG. 14B, the step-up control signal ΦPLS is maintained to be active. Accordingly, during the period T53–T54 and during the period T63–T64, the word line WL is stepped up to VPP, such that, in particular, writing of a logical "1" can be sufficiently conducted.

In other words, as described with reference to FIG. 2A, a logical "1" is written in a memory cell during the period after the voltage (ΦPLE) on the plate line PL has fallen. Therefore, by stepping up the word line voltage to VPP by making the step-up control signal ΦPLS to be active during the period T53–T54 in FIG. 13B or during the period T63–T64 in FIG. 14B, writing of a logical "1" can be sufficiently conducted.

It is noted that the invention is not limited to the embodiments described above, and various changes can be made within the scope of the subject matter of the invention. For example, the terms (N-type, 0V (GND), VCC, etc.) cited in the descriptions in the specification or drawings for the broadly-defining or similarly-defining terms (first conductive type, first power supply, second power supply, etc.) can be replaced with broadly-defining or similarly-defining terms in other parts of the descriptions in the specification or drawings.

Also, the embodiment is described as to the case where a memory cell array is divided into two blocks as indicated in FIG. 3, and each plate line is hierarchized into two hierarchical groups. However, the invention is not limited to this embodiment. For example, a structure in which a memory cell array is divided into three or more blocks, and each plate line is hierarchized into three or more hierarchical groups is also included in the scope of the invention.

Also, the overall structure of the ferroelectric memory is not limited to the structure described with reference to FIG. 3 and FIG. 4. For example, the arrangement locations of the PL selection circuits and WL selection circuits are not limited to the locations in FIG. 3 and FIG. 4, and many changes can be made. Further, the methods for generating various signals such as the step-up control signal are not limited to the methods described in the embodiment. Also, the ferroelectric memory may be used as a logic circuit.

The entire disclosure of Japanese Patent Application No. 2004-349995, filed Dec. 2, 2004 is expressly incorporated by reference herein.

What is claimed is:

1. A ferroelectric memory comprising: a memory cell array having a plurality of memory cells with ferroelectric capacitors arranged therein, a plurality of word lines, a plurality of plate lines, and a plurality of plate line selection circuits, wherein
   an L-th plate line selection circuit among the plurality of plate line selection circuits includes a first transistor that is provided between an L-th plate line and a supply node for supplying an I-th plate line selection signal and turns on when a K-th word line is set to a selection voltage to thereby supply the I-th plate line selection signal to the L-th plate line, and a second transistor that is provided between the L-th plate line and a first power supply and turns on when the K-th word line is set to a non-selection voltage to thereby set the L-th plate line to a voltage level of the first power supply, and
   an M-th plate line selection circuit among the plurality of plate line selection circuits includes a third transistor that is provided between an M-th plate line and a supply node for supplying a J-th plate line selection signal and turns on when the K-th word line is set to a selection voltage to thereby supply the J-th plate line selection signal to the M-th plate line, and a fourth transistor that is provided between the M-th plate line and the first power supply and turns on when the K-th word line is set to a non-selection voltage to thereby set the M-th plate line to the voltage level of the first power supply.

2. A ferroelectric memory according to claim 1, further comprising an inverter circuit that receives an input signal from the K-th word line and outputs an inversion signal of the input signal, wherein the inverter circuit is shared between the L-th plate line selection circuit and the M-th plate line selection circuit.

3. A ferroelectric memory according to claim 1, wherein a plate line selection signal is shared between a plate line selection circuit for the K-th word line and a plate line selection circuit for a (K+1)-th word line.

4. A ferroelectric memory according to claim 1, further comprising a plurality of word line step-up circuits, wherein
   a K-th word line step-up circuit among the plurality of word line step-up circuits includes a step-up capacitor having one end connected to the K-th word line and another end connected to a first node, and a fifth transistor that is provided between a supply node for supplying a step-up control signal and the first node, and turns on when the K-th word line is set to a selection voltage to thereby supply the step-up control signal to the first node.

5. A ferroelectric memory according to claim 4, wherein the K-th word line step-up circuit includes a sixth transistor that is provided between the first node and the first power supply, and turns on when the K-th word line is set to a non-selection voltage to thereby set the first node to a voltage level of the first power supply.

6. A ferroelectric memory according to claim 4, wherein the ferroelectric memory includes a step-up control signal generation circuit that generates the step-up control signal, wherein the step-up control signal generation circuit sets the step-up control signal to be active during a given period after a plate line timing signal for setting signal change timings of the I-th and J-th plate line selection signals becomes non-active from active.

7. A ferroelectric memory according to claim 4, further comprising an inverter circuit that receives an input signal from the K-th word line and outputs an inversion signal of the input signal, wherein the inverter circuit is shared by the L-th plate line selection circuit, the M-th plate line selection circuit and the K-th word line step-up circuit.

8. A ferroelectric memory comprising: a memory cell array having a plurality of memory cells with ferroelectric capacitors arranged therein, a plurality of word lines, a plurality of plate lines, a plurality of plate line selection circuits, and a plurality of word line step-up circuits, wherein.
   an L-th plate line selection circuit among the plurality of plate line selection circuits includes a first transistor that is provided between an L-th plate line and a supply node for supplying an I-th plate line selection signal and turns on when a K-th word line is set to a selection voltage to thereby supply the I-th plate line selection signal to the L-th plate line, and a second transistor that is provided between the L-th plate line and a first power supply and turns on when the K-th word line is set to a non-selection voltage to thereby set the L-th plate line to a voltage level of the first power supply, and
   a K-th word line step-up circuit among the plurality of word line step-up circuits includes a step-up capacitor having one end connected to the K-th word line and another end connected to a first node, and a third transistor that is provided between a supply node for supplying a step-up control signal and the first node, and turns on when the K-th word line is set to a selection voltage to thereby supply the step-up control signal to the first node.

9. A ferroelectric memory according to claim 8, wherein the K-th word line step-up circuit includes a fourth transistor that is provided between the first node and the first power supply, and turns on when the K-th word line is set to a non-selection voltage, to thereby set the first node to the voltage level of the first power supply.

10. A ferroelectric memory according to claim 8, further comprising a step-up control signal generation circuit that generates the step-up control signal, wherein the step-up control signal generation circuit sets the step-up control signal to be active during a given period after a plate line timing signal for setting the signal change timing of the I-th plate line selection signal becomes non-active from active.

11. A ferroelectric memory comprising: a memory cell array having a plurality of memory cells with ferroelectric capacitors arranged therein, a plurality of word lines, a plurality of plate lines, and a plurality of word line step-up circuits, wherein a K-th word line step-up circuit among the plurality of word line step-up circuits includes a step-up capacitor having one end connected to a K-th word line and another end connected to a first node, and a first transistor that is provided between a supply node for supplying a step-up control signal and the first node, and turns on when the K-th word line is set to a selection voltage to thereby supply the step-up control signal to the first node.

12. A ferroelectric memory according to claim 11, wherein the K-th word line step-up circuit includes a second transistor that is provided between the first node and a first power supply, and turns on when the K-th word line is set to a non-selection voltage to thereby set the first node to a voltage level of the first power supply.

* * * * *